United States Patent [19]
Okubo et al.

[11] Patent Number: 5,670,889
[45] Date of Patent: Sep. 23, 1997

[54] PROBE CARD FOR MAINTAINING THE POSITION OF A PROBE IN HIGH TEMPERATURE APPLICATION

[75] Inventors: Masao Okubo, Nishinomiya; Nobuyuki Murakami, Amagasaki; Kouji Katahira, Kikuchi-gun; Hiroshi Iwata, Otokuni-gun; Kazumasa Okubo, Naka-gun, all of Japan

[73] Assignee: Nihon Denshizairyo Kabushiki Kaisha, Amagasaki, Japan

[21] Appl. No.: 404,729

[22] Filed: Mar. 15, 1995

[30] Foreign Application Priority Data

Oct. 17, 1994 [JP] Japan .................................. 6-278447

[51] Int. Cl.$^6$ ................................................ G01R 31/02
[52] U.S. Cl. ........................... 324/760; 324/761; 324/762
[58] Field of Search ........................ 324/158.1, 73.1, 324/72.5, 754, 755, 762; 439/482

[56] References Cited

U.S. PATENT DOCUMENTS

| | | | |
|---|---|---|---|
| 3,984,620 | 10/1976 | Robillard et al. | 324/158.1 |
| 4,518,914 | 5/1985 | Okubo et al. | 324/762 |
| 4,567,433 | 1/1986 | Ohkubo et al. | 324/762 |
| 4,719,417 | 1/1988 | Evans | 324/762 |
| 5,134,365 | 7/1992 | Okubo et al. | 324/754 |

*Primary Examiner*—Vinh P. Nguyen
*Attorney, Agent, or Firm*—Nikaido, Marmelstein, Murray & Oram LLP

[57] ABSTRACT

Probe card is a part which is incorporated into a probing equipment to test finished IC chips. This card is customarily mounted with a plurality of probes, very fine needle and generally bent, and each probe is disposed so that its front end may pinpoint to a pad of an IC chip of interest. In performing the probing test, a most important condition is to keep the probe contact pressure on the pad of an IC chip at a constant position during measurement time, but in performing such at a high temperature, heated IC chips radiate the probe card and thereby positional deviation of the contact point is caused by heat expansion of the probe card and hence the contact pressure may change. The invented probe card employs a ceramic material in fabricating the probe card for possessing a very low expansion coefficient or for possessing an equivalent coefficient value to the IC chip or wafers, thereby the positional deviation of the probe contact is avoided and other devices to cope with difficulties caused by performance at a high temperature are disclosed.

13 Claims, 13 Drawing Sheets

PROBE CARD FOR MAINTAINING THE POSITION OF A PROBE IN HIGH TEMPERATURE APPLICATION

FIELD OF THE INVENTION

The present invention relates to a probe card to inspect the objectives of interest which are kept at a high temperature. The probe card is a part which is incorporated into a probing equipment (prober) to test finished IC chips. U.S. Pat. No. 5,134,365 is a reference to know what is the probe card, and the present invention is new development from such patented invention.

DESCRIPTION OF THE RELATED ART

A conventional probe card for high temperature application will be described with reference to FIG. 13.

As shown therein, a wafer 600 is placed on a wafer holder 700 which includes a built-in heater 710, and inspection of LSI chips (broadly IC chips) at a high temperature is performed with use of a probe card for high temperature application while the wafer 600 is heated about at 80° to 160° C.

The conventional probe card for high temperature application includes a print board 300 having a wiring pattern 310 and a probe 100 mounted on the print board 300. Generally the print board 300 is made from glass reinforced epoxy resin and structured with multiple layers to accept many probes.

Further, provided on the upper side of the print board 300 are connector ends 320 connected with the wiring pattern 330, and a via hole 210 is provided penetrating the print board 300 for connecting the wiring pattern 310 with the rear end of the probe 100.

Each probe 100 is secured to the print board 300 by a retainer 240 made of ceramic material on the under side of the print board 300, that is, on the surface opposing to the upper face of the wafer 600 where LSI chips (broadly IC chips) 610 are exposed. Such retainer 240 has a slope face 241 so that the probe 100 is attached at a straight midportion thereof by epoxy adhesive resin 270, and the rear end of the probe 100 is connected with the wiring pattern 310, in turn, with the connector ends 320 penetrating the via hole 210, wherein details of the interconnection therewith are not described or abbreviated here. The pointed front end, that is, contact portion 110 of the probe 100 is bent to point downwardly and is positioned for the contact portion 110 to pinpoint or to align accurately to a pad 611 of the LSI chip 610.

However, problems as below have been found with the conventional probe card for high temperature application as described. At the time of start of inspection or measurement, the probe front edge is accurately aligned and contacted with a pad 611 of the LSI chip 600 (although FIG. 13 does not show the contacted status) when the wafer 600 is heated and the board 300 is cold or at ambient temperature, but during the operation, the board 300 expands due to radiation from the wafer 600 or chips 610 lying under so that a contact point deviates and thereby reliable measurement on electrical characteristics of the chip 610 can not be carried out or become difficult.

The present invention is directed to overcoming such difficulties as described and offers a probe card free from the positional deviation during the measurement at a high temperature.

SUMMARY OF THE INVENTION

A first aspect of the present invention relates to a probe card for high temperature application wherein objectives of interest are measured of electrical characteristics in a heated condition without difficulties related to positional deviations due to deformation of the print board and with accuracy. Particularly, the probe card of the present invention comprises: a probe for contacting a pad of an objective of interest, a ceramic board for mounting the probe, a print board having a wiring pattern, a means for maintaining a space between the print board and the ceramic board, an interconnector for connecting the wiring pattern with the probe. Therein the space between the print board and the ceramic board is available for air ventilation to cool sot as to resist to a uprise in the temperature.

A second aspect of the present invention relates to a probe card for high temperature application wherein the ceramic board is made of a material having nearly the same thermal expansion coefficient so that the deformation or thermal expansion of both the objective of interest and the ceramic board become equivalent so as to minimize a positional deviation of the probe, thus, to attain accurate measurement.

A third aspect of the present invention relates to a probe card for high temperature application wherein the interconnection for connecting the wiring pattern with the probe includes an electrical lead between the front end of the wiring pattern and the rear end of the probe so as to provide for accurate measurement.

A fourth aspect of the present invention relates to a probe card for high temperature application wherein the interconnection for connecting the wiring pattern with the probe includes a film of anisotropic electroconduction which is laid to bridge or fill the space between the print board and the ceramic board so as to direct the electroconduction therebetween. This means dispenses with wiring work for the connection, in turn, saving of effort in manufacture.

A fifth aspect of the present invention relates to a probe card for high temperature application wherein the interconnection for connecting the wiring pattern with the probe includes a spring pin, whereby soldering is needed only at one contact spot thereof with the print board or ceramic board, in turn, saving of effort in manufacture.

A sixth aspect of the present invention relates to a probe card for high temperature application wherein the probe retainer made of a thermally durable material is mounted on the ceramic board to hold the probe at its straight midportion so as to stand against a high temperature atmosphere and to avoid deformation or positional deviation of the retainer, in turn, to avoid positional deviation of the probe.

A seventh aspect of the present invention relates to a probe card for high temperature application wherein the ceramic board comprises a ceramic central board and an non-ceramic outer board to support the central board, and the central board is made thinner than the outer support board. Whereby an amount required to mold a ceramic product with high cost is saved as a whole, in turn, cost saving.

An eighth aspect of the present invention relates to a probe card for high temperature application wherein the central ceramic board is mounted with a probe and an interconnection. Whereby accurate measurements are permitted without positional deviation.

These drawings are presented to illustrate the invention and therefore these should not be construed as limiting the invention.

DESCRIPTION OF THE EMBODIMENTS OF THE PRESENT INVENTION

In the following, the description will proceed with reference to the drawings, wherein a like numeral indicates a like part throughout all the drawings.

Figure 1:
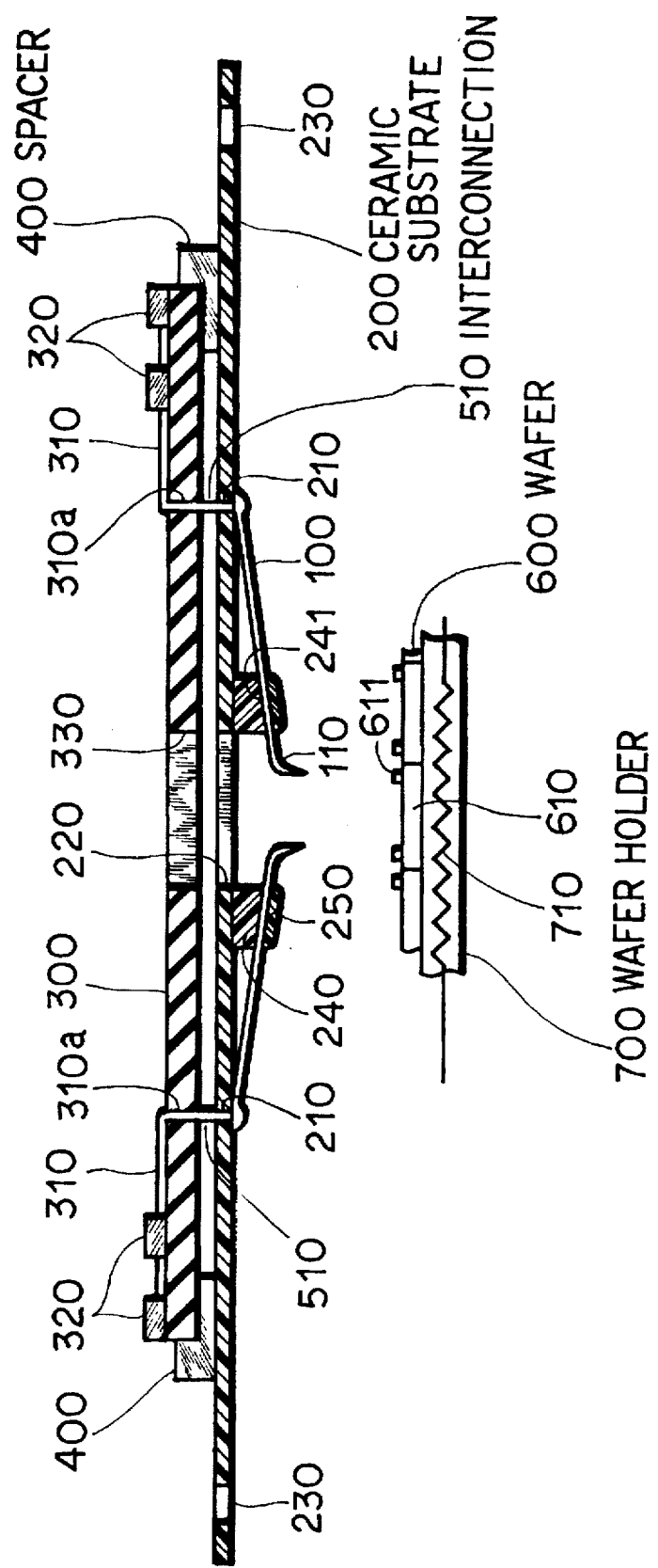
FIG. 1 shows a schematic sectional view of a probe card belonging to a first embodiment of the present invention.
Figure 2:
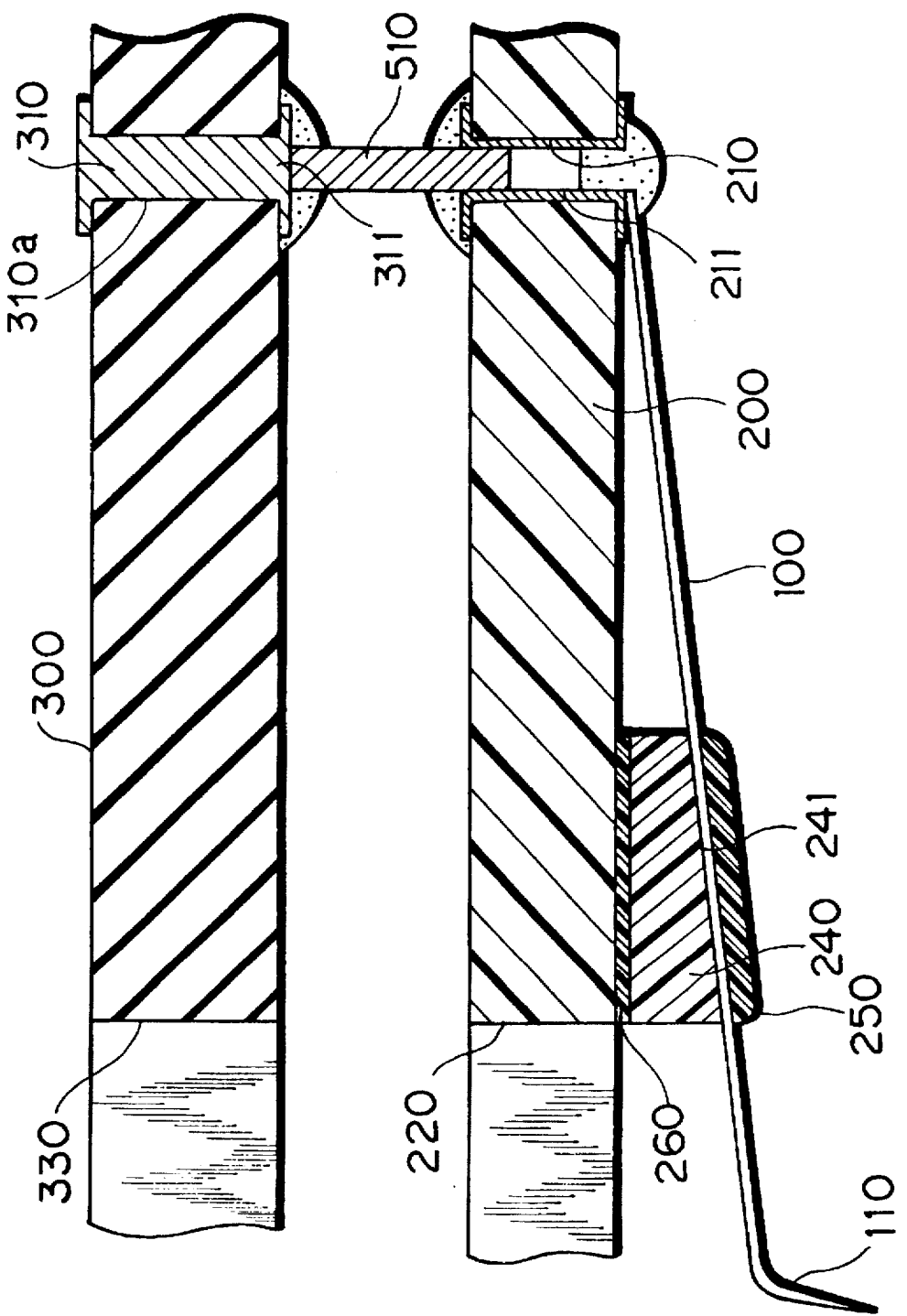
FIG. 2 shows an enlarged portional view in section of the probe card as shown in FIG. 1.
Figure 3:
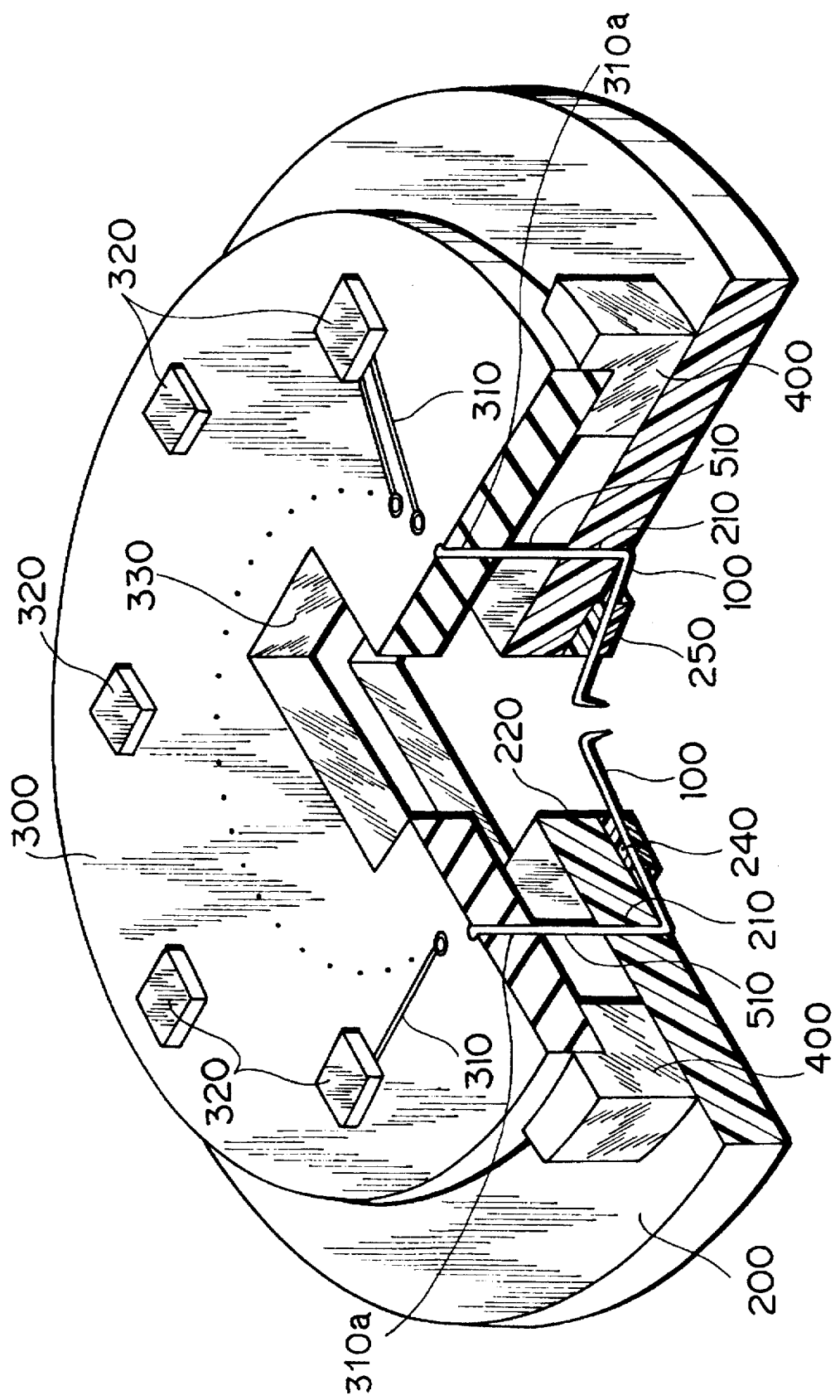
FIG. 3 shows a schematic perspective view of the probe card belonging to the first embodiment with a quarter sector cutaway.

The first embodiment is shown in FIGS. 1 to 3 wherein a probe is indicated by the numeral 100. A piece of probe is a fine needle with one (front) end pointed and is bent at a point proximate to the front end 110, and each probe is secured to the under side of a substrate board 200 made of a ceramic material (in the following, 200 is named the ceramic board) so that the front end 110 points downwardly to a pad 611 of an LSI chip (broadly IC chip) 610. The LSI chips 610 are arranged on a wafer 600 and exposed upward so that each pad 611 takes a position right under the front end 110 of each probe 100 as noted. The wafer 600 is placed on a wafer holder 700 which includes a built-in heater 710.

The numeral 240 indicates a retainer to fix the probe front end 110 on a slope face 241 with use of a heat durable adhesive 250, for example epoxy adhesive or frit glass for sealing at low temperatures. These example adhesives are also available to fix the retainer 240 or the spacer 400. The numeral 300 indicates a print board which is held at a superposed position by spacers 400 with a space above the ceramic board 200, wherein this intervention of the ceramic board 200 between the print board 300 and the heated wafer 600 constitutes a barrier to direct heat radiation upward from the wafer 600. The ceramic board 200 is preferably made from a ceramic material having an expansion coefficient equivalent to that of the wafer 600, for example zircon.

The print board 300 is typically made of multiple layers of glass reinforced epoxy resin wherein each layer includes the wiring pattern for the source or signal circuit. The numeral 310 indicates a wiring pattern having connector ends 320. The wiring pattern 310 leads into a via hole 310a of the print board 300 and penetrates a via hole 210 of the ceramic board 200 to connect with the probe rear end at the under end of the via hole 210 or on the under side of the board 200. The numeral 510 indicates an interconnector for connecting the wiring pattern 310 with the probe rear end, of which details will be described later. The numerals 220, 330 indicate openings, best seen in FIG. 3, provided at a central portion of the ceramic board 200 and the print board 300 for visual observation by operators. These openings 220, 330 are not requisite. The numeral 230 is a hole available for mounting the ceramic board 200 to a frame or prober (probing equipment) (not shown).

FIG. 2 shows an assembly including the interconnector 510, in a form of lead wherein the number 311 indicates an end of the wiring pattern 310 which fills the via hole 310a, and 211 indicates a metal plating inside the via hole 210. A spot area (unnumbered) with dots indicates solder mass. The interconnector 510 has one end soldered on the end 311 and has other end inserted into the cylindrical plating-area, and the probe rear end (unnumbered) is soldered in contact with the plating 211. Thus an interconnection device is attained. However, such modification is available as the interconnector 510 is made long enough to reach the under side of the ceramic board 200 and the plating 211 is dispensed with and the interconnector 510 is directly soldered in contact with the probe rear end.

As for FIG. 3, it is assumed that what is shown by this figure will be understandable by description so far with ordinary knowledge possessed by persons in the art. In the following, functions of the first embodiment will be described.

When the measurement at a high temperature starts, heat radiation arising on the wafer holder 700 or the wafer 600 is conveyed to the probe card assembly, that is, to the under side of the ceramic board 200, and in turn, to the print board 300. Therein the ceramic board 200 has so minor expansion coefficient that at a temperature from 80° to 160° C., the ceramic board 200 has little expansion. On the other hand, the print board 300 has somewhat expansion under effect of such temperatures. But the probes 100 are secured to the ceramic board 200, instead of the print board 300, so that expansion of the print board 300 has minuscule or insignificant effect to positions of the probe front ends 110. Thus the probe front ends 110 are made free from positional deviation in the case of the probe card for high temperature application of the present invention.

Figure 4:
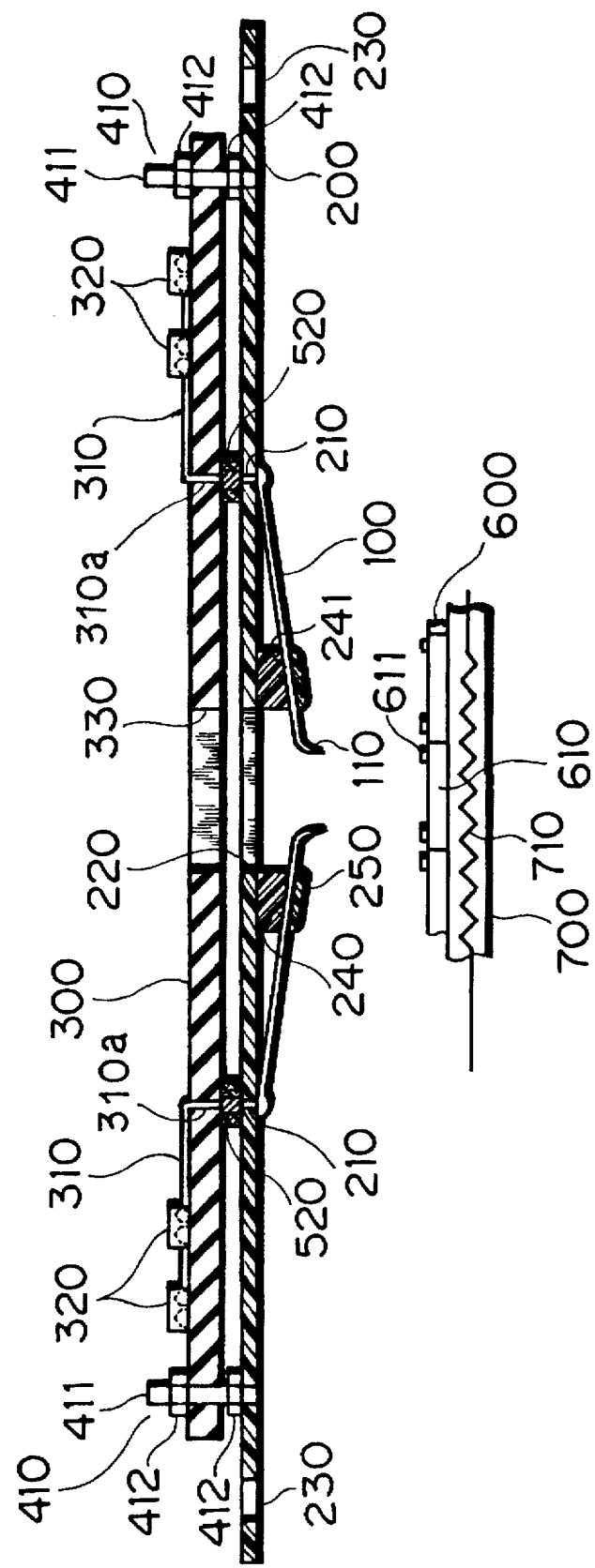
FIG. 4 shows a schematic sectional view of a probe card belonging to a second embodiment of the present invention.
Figure 5:
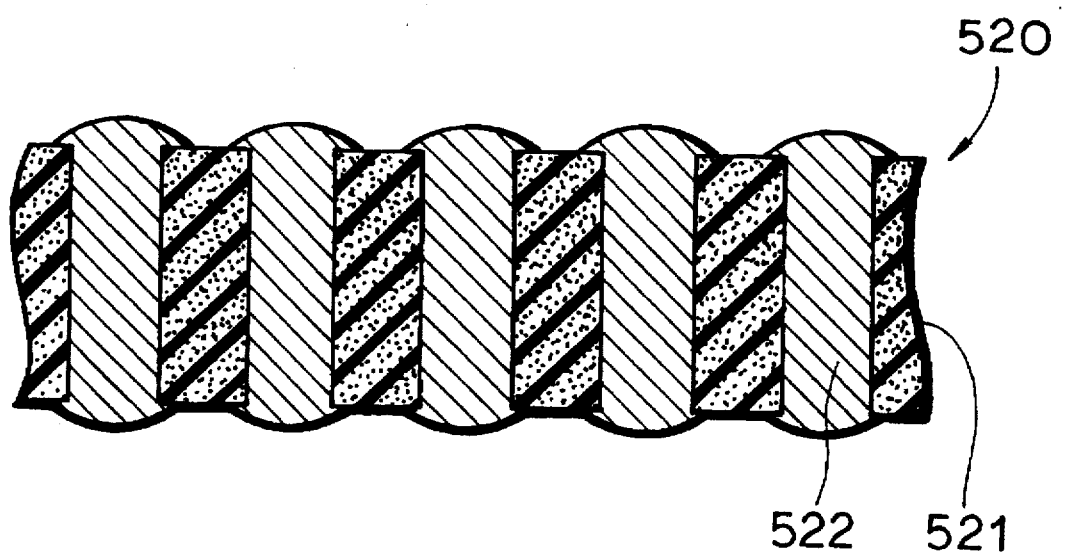
FIG. 5 shows a schematic sectional view of a film of anisotropic electroconduction which is included in the second embodiment.
Figure 6:
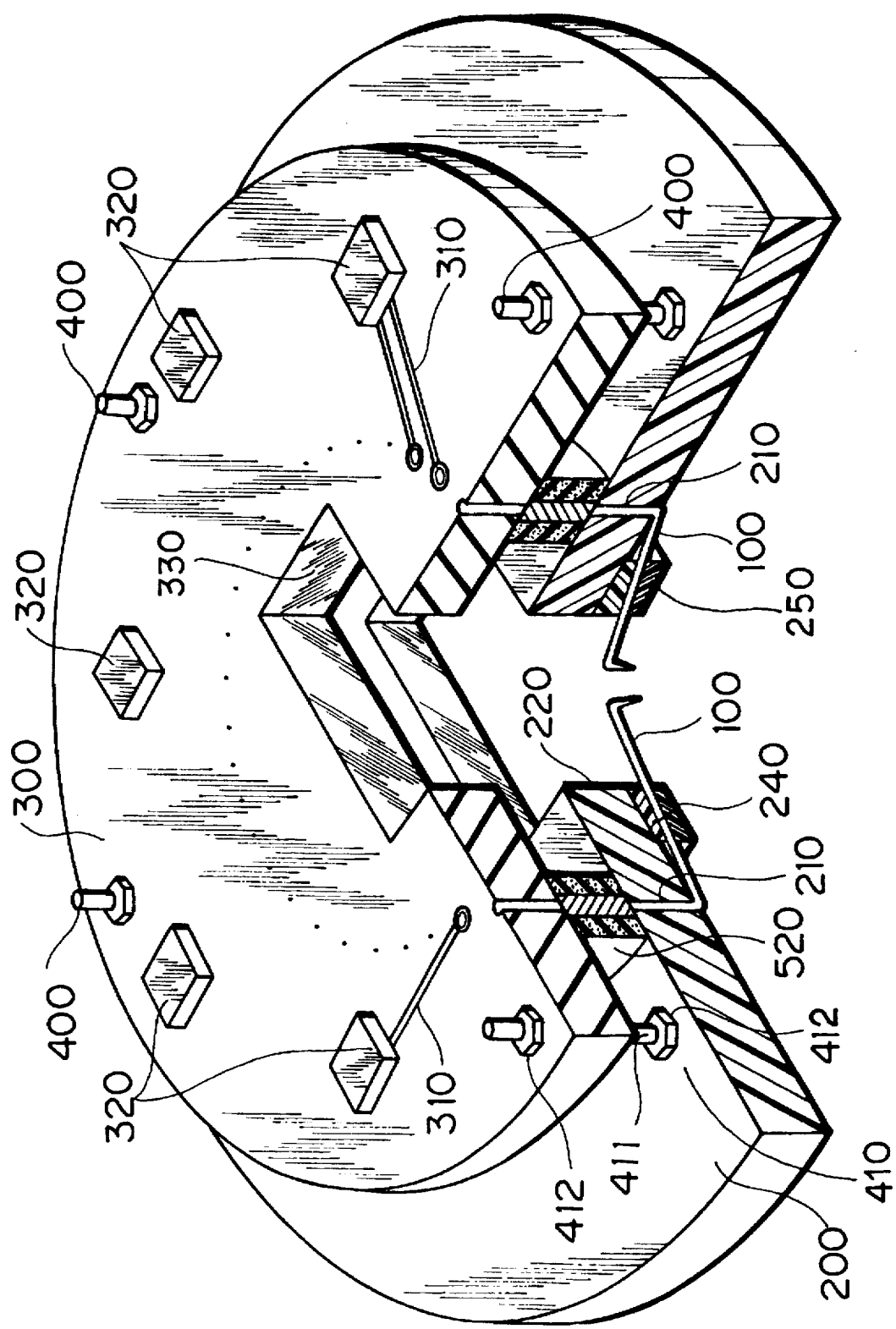
FIG. 6 shows a schematic perspective view of the probe card belonging to the second embodiment with a quarter sector cutaway.

Next, the second embodiment will be described with reference to FIGS. 4 to 6, wherein matters similar to those described above will be abbreviated and the following description will be concentrated on matters new or different from above.

The second embodiment substantially differs from the first embodiment in the points of an interconnection device for connecting the wiring pattern 310 with the probe 100, and a means mounted on the ceramic board 200 to hold the print board 300 with a space from the ceramic board 200.

Referring to the interconnection device, an anisotropic electroconductive film 520 is applied in the second embodiment. The anisotropic electroconductive film 520, as shown in FIG. 5, includes a base film 521 made of thermally durable material having somewhat resiliency, for example polyimide, with electroconductive lines (thin fibers) 522, for example aluminum, penetrating through the base film 521 with equal density over the surface area of the base film, wherein preferably each head of the line is gold plated to have enhanced electroconduction in contact. In assembling this anisotropic film 520 into the probe card system, the anisotropic film 520 angled the lines 522 standing or vertical is placed on the upper side of the ceramic board 200 at locations to fit the via holes 310a and 210, and then the films 520 is somewhat pressed by the print board 300 wherein it is assumed that the end 311 of the wiring pattern 310 is filled in the via hole 310a from above and the rear end of the probe 100 is filled in the via hole 210 from under. Thus interconnection is attained wherein the electroconductive lines are implanted so dense that just a press from above by the print board 300 results in an adequate interconnection without fear of poor conduction. This means offers large convenience in manufacture.

Turning to the spacer means 410 of the second embodiment, in use of the anisotropic film 520, it is required to press such films with some pressure from above to fix between the ceramic board 200 and the print board 300. Accordingly a clamping means including a bolt 411 and a nut 412 as shown in FIGS. 4 and 6 is desirable. However, overclamping should be avoided so as to retain a reasonable gap distance. Functions attained by the second embodiment are much the same as those in the first embodiment.

Figure 7:
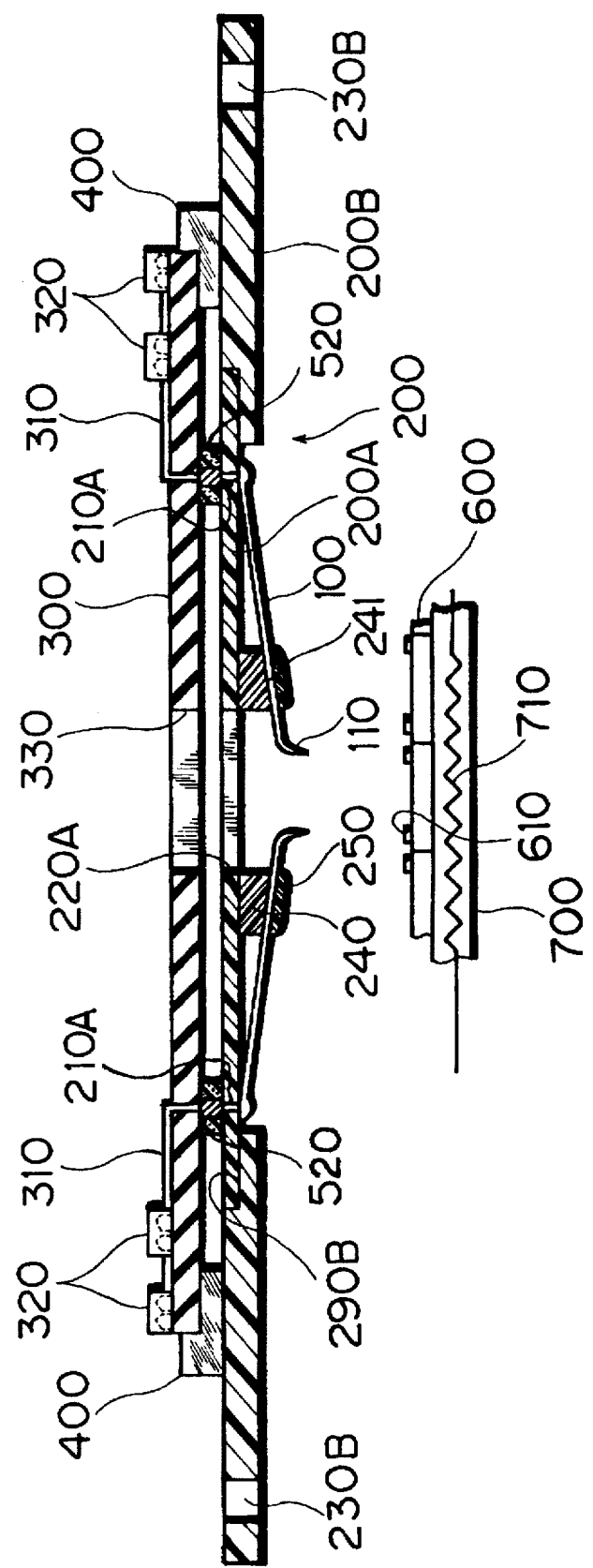
FIG. 7 shows a schematic sectional view of a probe card belonging to a third embodiment of the present invention.
Figure 8:
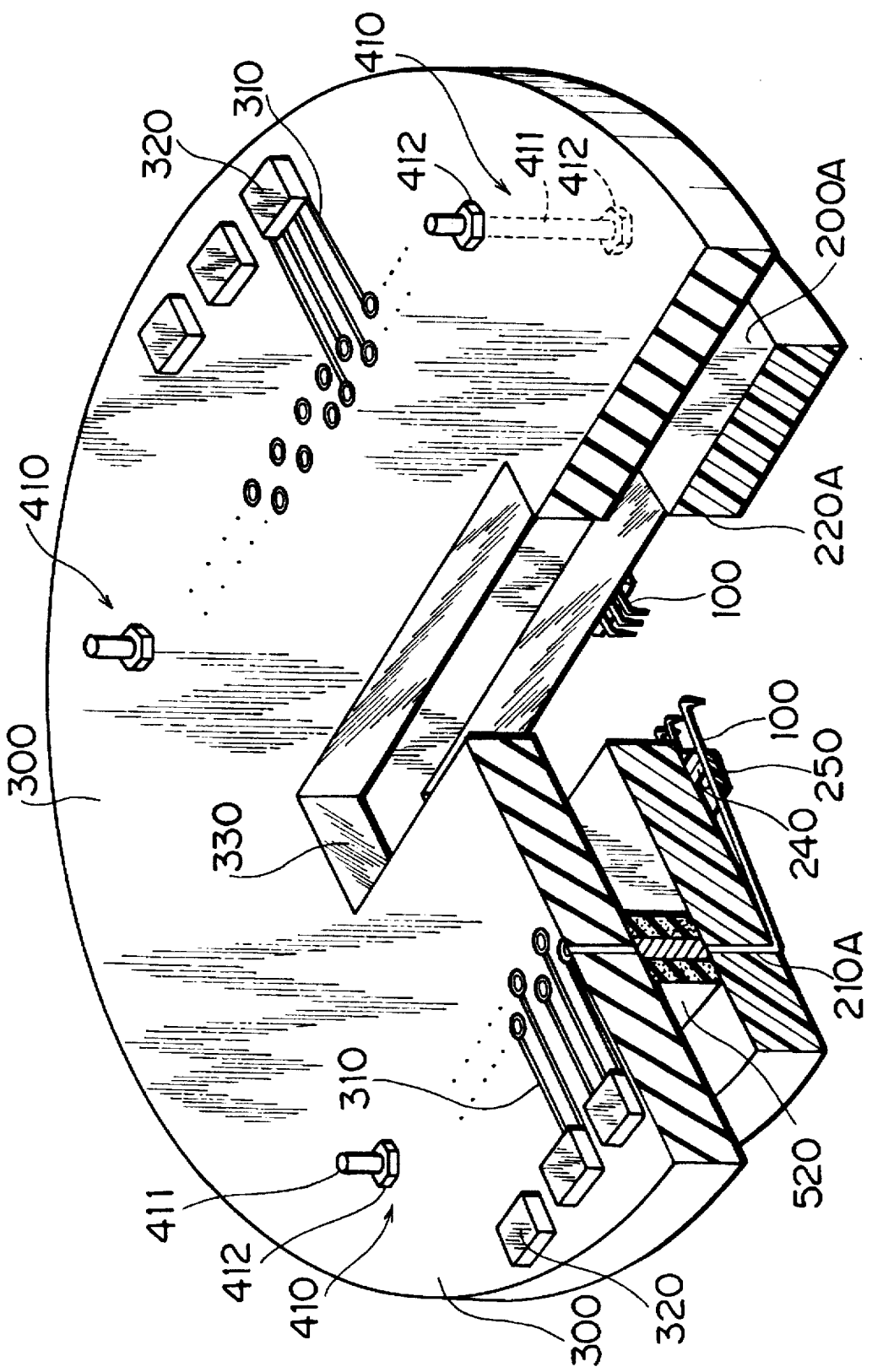
FIG. 8 shows a schematic perspective view of the probe card belonging to the third embodiment with a quarter sector cutaway.
Figure 9:
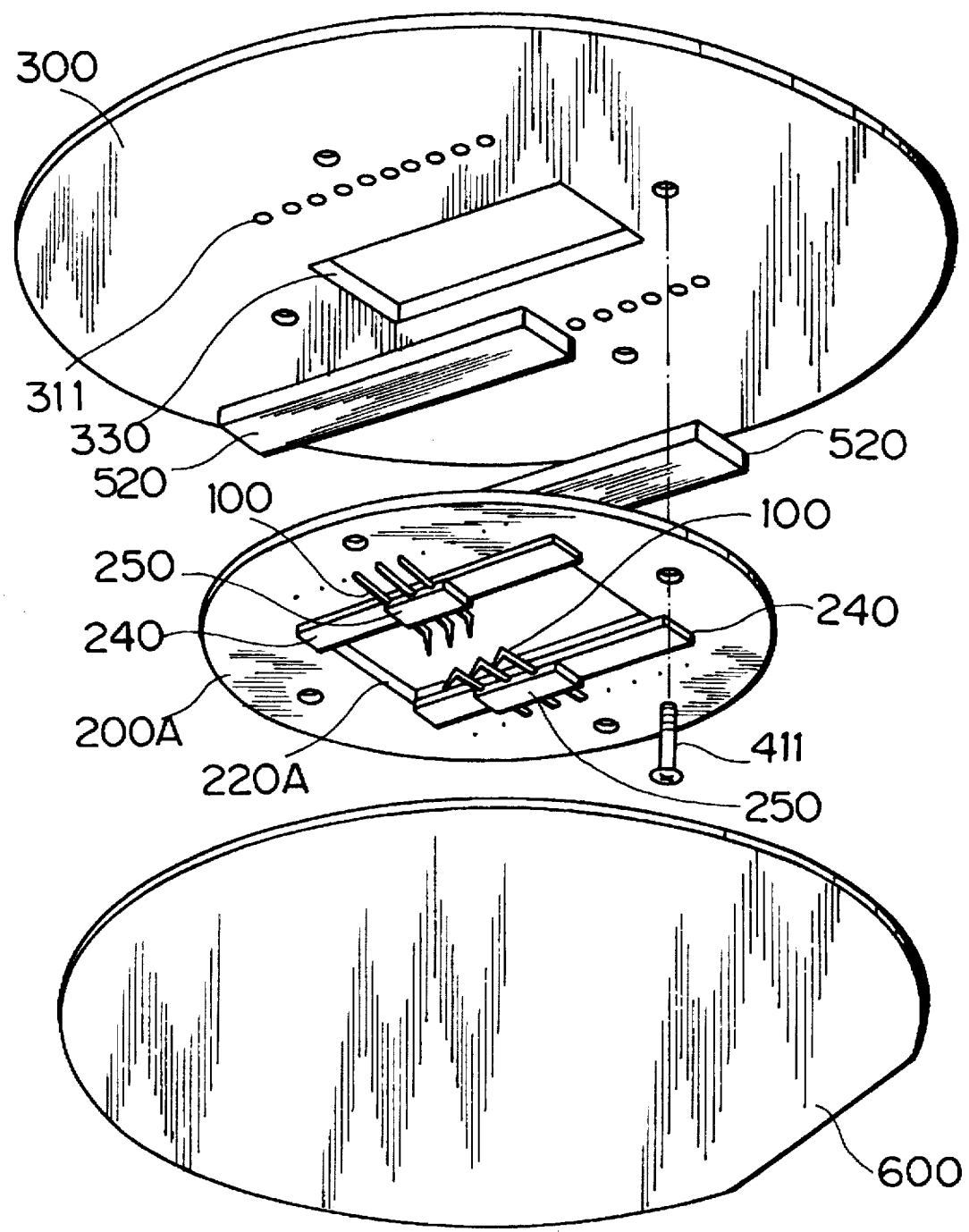
FIG. 9 shows an exploded schematic perspective view of the probe card belonging to the third embodiment as viewed at a looking up angle.

Next, the third embodiment will be described with reference to FIGS. 7 to 9, wherein difference from preceding ones exits mainly in the structure of the ceramic board 200. That is, in this embodiment, the ceramic board 200 comprises two parts: a central board 200A made from ceramic and an outer board 200B made from non-ceramic material, wherein the central board 200A includes mounting of the interconnector between the wiring pattern 310 and the probe 100, and the central board 200A is preferably molded from zircon which a heat expansion coefficient value equivalent to the wafer 600 including the LSI chips 610.

The central board 200A has at its center an opening 220A and at its outer area a via hole 210A, of which inside surface is metal plated (but the metal plating is not apparent in FIG. 7), and at the periphery of the opening 220A a retainer 240 is mounted which retains the probe 100 in much the same manner as described before. The outer board 200B has a form of a ring and has a step at its inner edge to engage the periphery of the central board 200A, and has at outer area a via hole 230B for much the same function as the hole 230 in the previous examples and the board 200B is typically made from a metal or plastic (non-ceramic material) and is shown only in FIG. 7, but not in FIGS. 8 and 9. Further, in the third embodiment, the interconnector is an anisotropic film as described in the second embodiment and the spacer 400 (applied in the first embodiment) is employed.

The third embodiment as described features decrease in the amount required to fabricate the ceramic board wherein a ceramic product with high cost is limited to the central portion, and this performs much the same attainment avoiding the positional deviation as in the previous embodiments.

Figure 10:
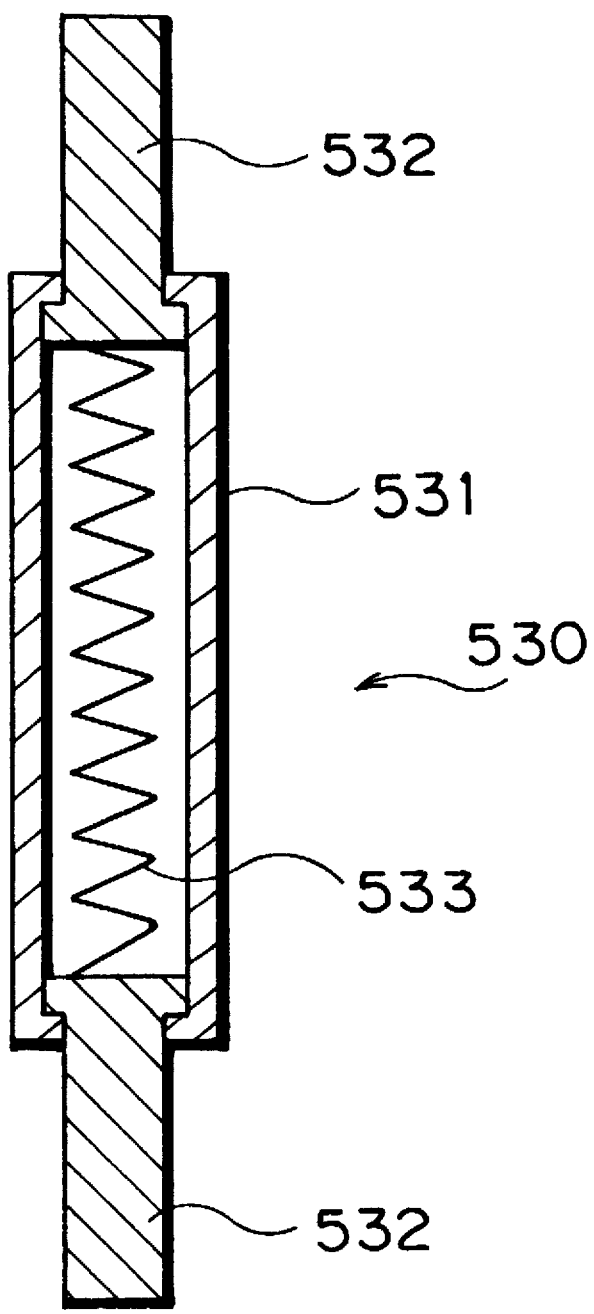
FIG. 10 shows a sectional view of another embodiment of an interconnection which comprises a spring pin in the concept of the third embodiment.

In the three embodiments so far, the interconnection device comprises the electrical lead 510 or the anisotropic film 520, and now a spring pin 530 as shown in FIG. 10 is applicable as substitute, wherein the spring pin 530 comprises a cylinder 531, in which a spring 533 is housed and at the two ends of the cylinder 531, a pair of headed pins 532 is mounted extending legs. This spring pin 530 is desirably manufactured in an electroconductive material.

Figure 11:
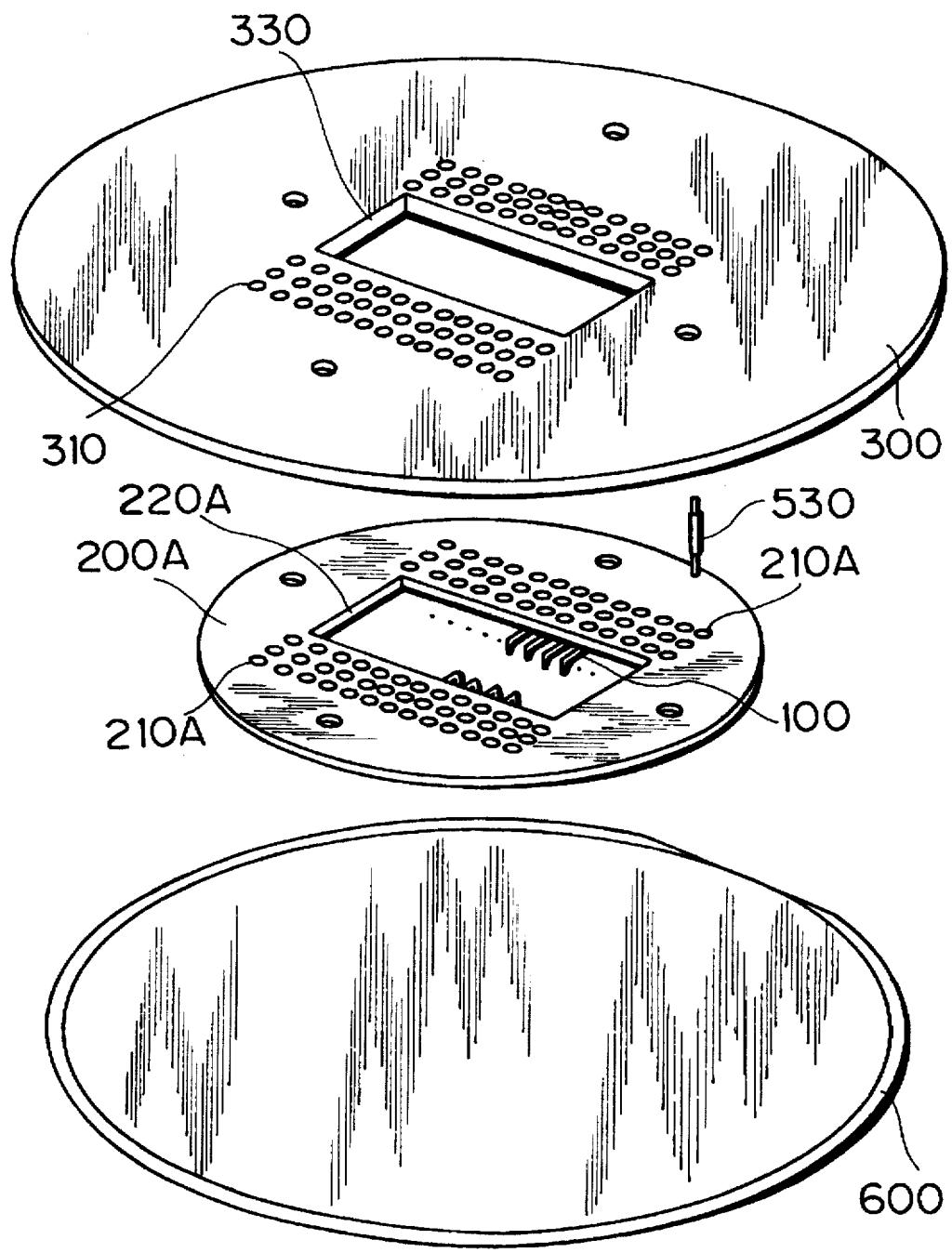
FIG. 11 shows an exploded schematic perspective view of the probe card belonging to the third embodiment which includes a spring pin, as viewed at a looking down angle.

The third embodiment in which the spring pin 530 is incorporated as the interconnector will be described with reference to FIG. 11. Therein, one of the paired pins 532 of the spring pin 530 is connected by soldering with an end 311 of the wiring pattern 310 although not shown in FIG. 11, (but shown in FIG. 2,) and the print board 300 is mounted with the ceramic board 200 by the bolt and nut 400, 410. Thereby the other pin 532 of the spring pin 530 is inserted into the via hole 210A of the central board 200A to make contact with the metal plating 211. In the case where the rear end of the probe 100 is inserted into the via hole 210, the contact is made with the rear end thereof.

Figure 12:
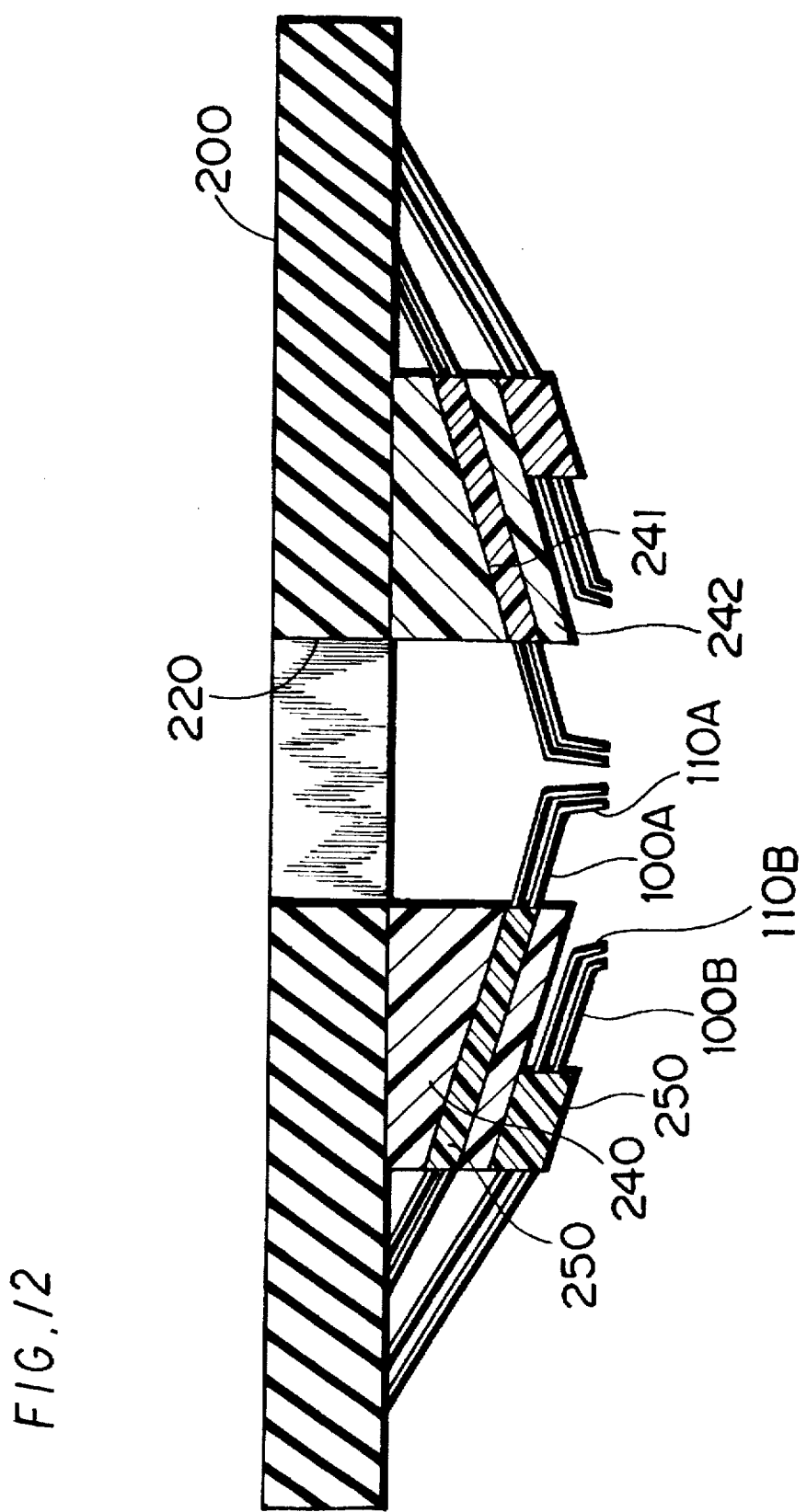
FIG. 12 shows a schematic sectional view of key portions of a probe card belonging to another embodiment of the present invention featuring a denser equipment of probes.
Figure 13:
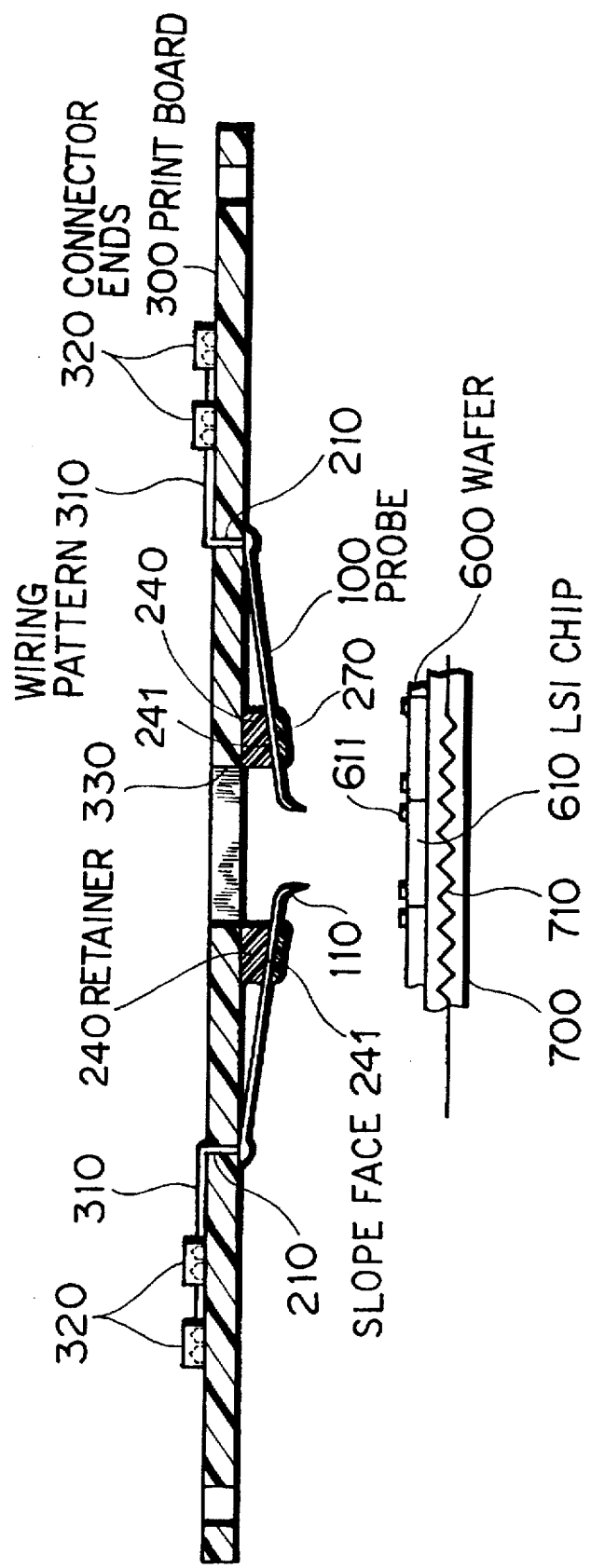
FIG. 13 shows a schematic sectional view of key portions of a conventional probe card for high temperature application.

In the three embodiments as described, the probe 100 is shown as having one circular arrangement, but the arrangement may have two or more circulars. For example as shown in FIG. 12, on the slope face 241 of the retainer 240 the inner arranged probes 100A are secured by mounts 250 formed with use of durable adhesives or frit glass for sealing at low temperature, (until this point of the description, construction is much the same as previously described,) and thereover a laminating member 242 is added to secure the outer arranged probes 100B by a similar manner as noted, wherein the front ends 110A of the inner probes 100A and the front ends 110B of the outer probes 100B are assumed to be flush each other symmetrically keeping the same length of front ends from the retainer mounts 250, 250 to so as to attain good contact with pads of LSI chips, not shown, and such arrangement as noted does not provide any error caused by difference in contact pressure by the probes.

It is further understood that the form of the present invention herein shown and described is a preferred embodiment of the disclosed assembly and that various changes and modifications may be made in the present invention without departing from the above teachings.

What is claimed is:

1. A probe card for testing semiconductor wafers at a high temperature comprising: a probe for contacting the semiconductor wafers, a ceramic board, the probe being secured to one side of the ceramic board, a print board including a wiring pattern, means for holding the print board at a superposed position spaced from the ceramic board at the other side of the ceramic board so as to decrease deformation of the print board at a high temperature, and an interconnector between the wiring pattern and the probe.

2. A probe card for testing semiconductor wafers at a high temperature as claimed in claim 1, wherein the ceramic board is made from a material of which thermal expansion coefficient is equivalent to the same coefficient of the semiconductor wafers.

3. A probe card for testing semiconductor wafers at a high temperature as claimed in claims 1, or 2, wherein the ceramic board comprises two parts: a ceramic central board and a non-ceramic outer board for holding the ceramic central board.

4. A probe card for testing semiconductor wafers at a high temperature as claimed in claim 3, wherein the ceramic central board provides mounts for the probes and the wiring patterns.

5. A probe card for testing semiconductor wafers at a high temperature as claimed in claim 3, wherein the ceramic central board is mounted with a retainer which retains the probe at its straight midportion and is durable in a high temperature atmosphere for performing the test.

6. A probe card for testing semiconductor wafers at a high temperature as claimed in claim 5, wherein the retainer is secured by an adhesive durable in a high temperature atmosphere for performing the test.

7. A probe card for testing semiconductor wafers at a high temperature as claimed in claim 6, wherein the adhesive durable in a high temperature is heat durable epoxy adhesive or frit glass for sealing at low temperature.

8. A probe card for testing semiconductor wafers at a high temperature as claimed in claims 1, or 2, wherein the ceramic board is mounted with a retainer on said one side which retains the probe at its straight midportion and is durable in a high temperature atmosphere for performing the test.

9. A probe card for testing semiconductor wafers at a high temperature as claimed in claim 8, wherein the retainer is secured by an adhesive durable in a high temperature atmosphere for performing the test.

10. A probe card for testing semiconductor wafers at a high temperature as claimed in claim 9, wherein the adhesive durable in a high temperature is heat durable epoxy adhesive or frit glass for sealing at low temperature.

11. A probe card for testing semiconductor wafers at a high temperature as claimed in claim 1, wherein the interconnector is a lead connecting a front end of the wiring pattern with a rear end of the probe.

12. A probe card for testing semiconductor wafers at a high temperature as claimed in claim 1, wherein the interconnector is an anisotropic film of electroconduction.

13. A probe card for testing semiconductor wafers at a high temperature as claimed in claim 1, wherein the interconnector is a spring pin.

\* \* \* \* \*